United States Patent [19]

Landt

[11] Patent Number: 5,285,120

[45] Date of Patent: Feb. 8, 1994

[54] BROADBAND PHASE SPLITTER

[75] Inventor: Harvey L. Landt, Cedar Rapids, Iowa

[73] Assignee: Rockwell International Corporation, Seal Beach, Calif.

[21] Appl. No.: 246,122

[22] Filed: Sep. 15, 1988

[51] Int. Cl.$^5$ .......................... H02K 5/13; H03L 7/00
[52] U.S. Cl. .................... 307/513; 307/262; 333/100; 328/55
[58] Field of Search .............. 328/55; 307/262, 513; 333/100

[56] References Cited

U.S. PATENT DOCUMENTS

| | | | |
|---|---|---|---|
| 3,050,700 | 8/1962 | Powers | 328/55 X |
| 3,193,768 | 7/1965 | Scheyhing et al. | 328/55 X |
| 3,222,546 | 12/1965 | Woods et al. | 307/262 X |
| 3,436,647 | 4/1969 | Gobeli et al. | 307/262 X |
| 3,440,548 | 4/1969 | Saltzberg | 328/55 X |
| 3,715,479 | 2/1973 | Brush et al. | 307/262 X |
| 3,863,160 | 1/1975 | Doty | 328/55 X |
| 3,883,810 | 5/1975 | Tacussel | 328/55 X |
| 3,902,081 | 8/1975 | Schertz | 307/262 |
| 4,049,977 | 9/1977 | Radovsky | 307/262 |
| 4,160,952 | 7/1979 | Seastrand, Jr. | 325/369 |
| 4,232,399 | 11/1980 | Heiter | 455/276 |
| 4,309,649 | 1/1982 | Naito | 323/212 |
| 4,373,210 | 2/1983 | Karabinis et al. | 455/273 |
| 4,475,088 | 10/1984 | Beard | 331/25 |
| 4,542,309 | 9/1985 | Klein et al. | 307/513 |
| 4,614,885 | 9/1986 | Brosch et al. | 307/513 |
| 4,710,975 | 12/1987 | Okamoto et al. | 455/276 |
| 4,731,875 | 3/1988 | Mizukami et al. | 455/302 |
| 4,739,279 | 4/1988 | Pion | 307/262 X |

FOREIGN PATENT DOCUMENTS 0285813 12/1986 Japan .................. 307/513

Primary Examiner—Bernarr E. Gregory
Attorney, Agent, or Firm—John C. McFarren; M. Lee Murrah; H. Fredrick Hamann

[57] ABSTRACT

An electrical circuit provides a constant phase shift between two output signals derived from a common input. The output signals are designed to provide a constant phase shift at constant amplitude over a very large frequency range. The common input is provided to both a non-shift channel and a phase-shift channel. The non-shift channel comprises a fixed attenuator circuit that provides a non-shifted output signal. The phase shift channel comprises a low-pass RC filter circuit that provides a phase shifted output signal. The two output channels are connected by a transformer phase detector that generates an error signal. The error signal is input to an operational amplifier that provides a phase-shift control signal to the RC filter circuit of the phase-shift channel.

14 Claims, 2 Drawing Sheets

BROADBAND PHASE SPLITTER

TECHNICAL FIELD

The present invention relates to electrical phase shift circuits and, in particular, to a broadband phase splitter that provides a constant phase shift between two output signals derived from a common input.

BACKGROUND OF THE INVENTION

In some electrical circuits, such as single sideband and frequency off-set generators, it is desirable to split a signal into two phase shifted signals. Phase splitter circuits available in the prior art generally use complex passive and active tuned networks or comprise narrow-band systems having phase-locked voltage controlled oscillators. As a result, prior art phase splitters generally comprise complex circuits that consume large amounts of power or systems constrained to operate in narrow frequency bands.

Because of the limitations of prior art systems, there is a need for a simplified circuit that has low power consumption and that provides a constant phase shift between two output signals over a broad frequency range. In addition, it is desirable that the two output signals of the phase splitter have constant output amplitude proportional to the input signal.

SUMMARY OF THE INVENTION

The present invention comprises an electrical circuit that provides a constant phase shift between two output signals that are derived from a common input. The output signals are designed to provide a constant phase shift over a very large frequency range. In addition, the phase shifted output signals are designed to have a constant output amplitude that is proportional to the input signal. Furthermore, the present invention comprises a simplified phase splitter circuit that has the economic advantage of very low power consumption.

In the phase splitter of the present invention, the common input is provided to a phase shift channel and to a non-shift channel. The non-shift channel comprises a fixed attenuator circuit that provides an output signal that is not phase shifted with respect to the input. The phase shift channel comprises a low-pass RC filter circuit that provides a phase shifted output signal. The RC filter may include pin diodes that function as current controlled resistors in the phase shift channel.

The two output channels of the phase splitter are connected by a transformer phase detector circuit that generates a dc error voltage. The error voltage is input to an operational amplifier that provides a dc phase shift control signal to the RC filter circuit of the phase shift channel. The phase detector and operational amplifier of the present invention can be designed to provide a phase shift of any value, including 90 degrees between the two output signals. Quadrature signals of this type are useful in single sideband generation and in offset frequency synthesizers such as those used in a tracking impedance measuring system.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which.

DESCRIPTION OF THE PREFERRED EMBODIMENT

Figure 1:
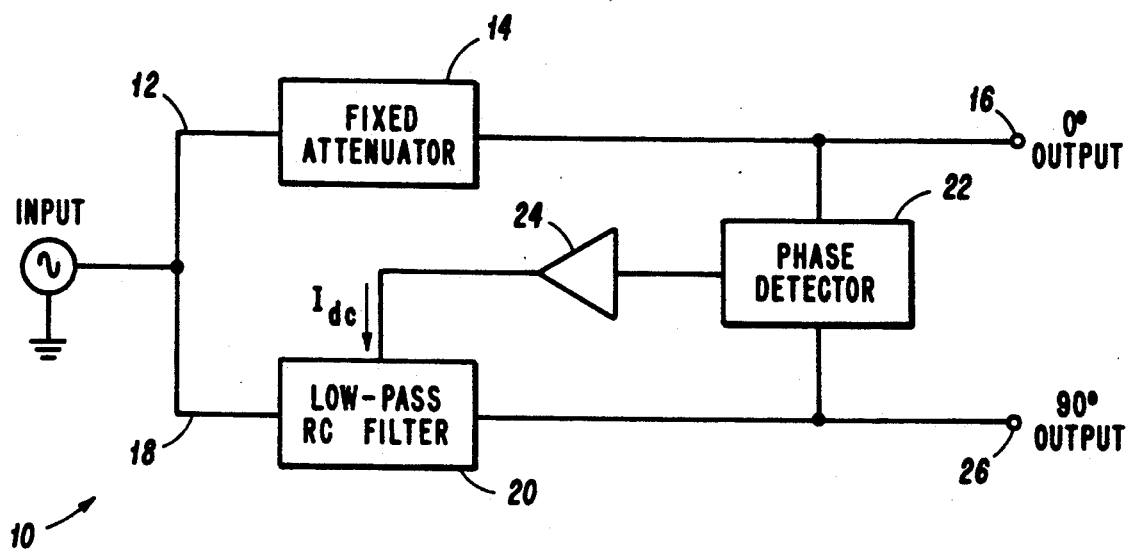
FIG. 1 is a block diagram of a broadband phase splitter circuit of the present invention.

Referring to FIG. 1, the broadband phase splitter 10 of the present invention is illustrated in block diagram form. The input to phase splitter 10 is provided to a first channel 12 and to a second channel 18. Channel 12 includes a fixed attenuator 14 that provides a non-shifted signal at output 16. Channel 18 includes a low-pass RC filter 20 that provides a phase-shifted signal at output 26. A phase detector 22 is connected between output 16 and output 26. Phase detector 22 generates an error signal that is input to operational amplifier 24. Operational amplifier 24 generates a dc control signal $I_{dc}$ that is provided to low-pass filter 20. Phase splitter 10 provides a constant phase shift between the signals at outputs 16 and 26 at constant amplitude and over a very large frequency range. In addition, the simplicity of phase splitter 10 results in very low power consumption.

Figure 2:
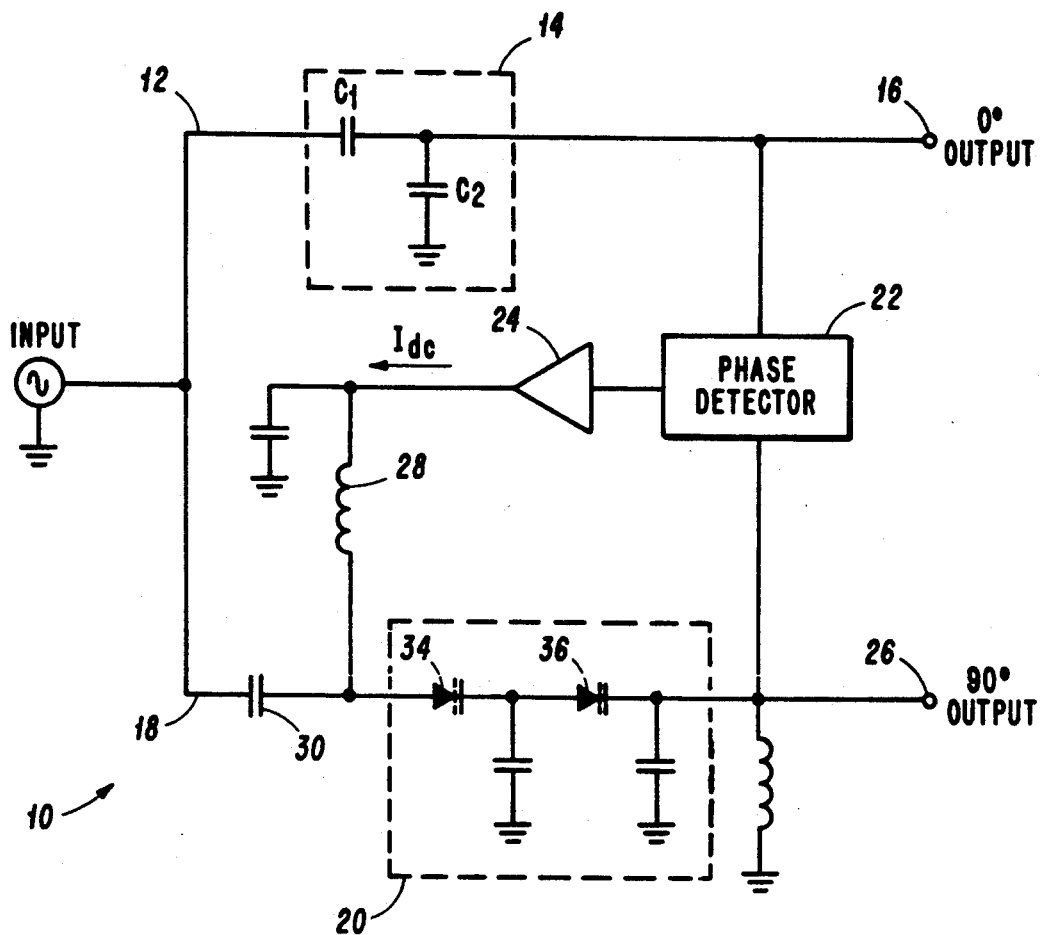
FIG. 2 is a simplified schematic diagram of the present invention.

Referring to FIG. 2, phase splitter 10 is illustrated in a simplified schematic diagram. Fixed attenuator 14 of non-shift channel 12 includes capacitors $C_1$ and $C_2$. The low-pass filter 20 on phase-shift channel 18 is separated from the input signal by capacitor 30 that acts as a dc block. Operational amplifier 24 generates a control signal $I_{dc}$ that is provided to low-pass filter 20 through and inductor 28 which acts as a radio frequency (rf) choke. Low-pass filter 20 includes pin diodes 34 and 36 that function as variable resistors with their value controlled by control current $I_{dc}$.

Figure 3:
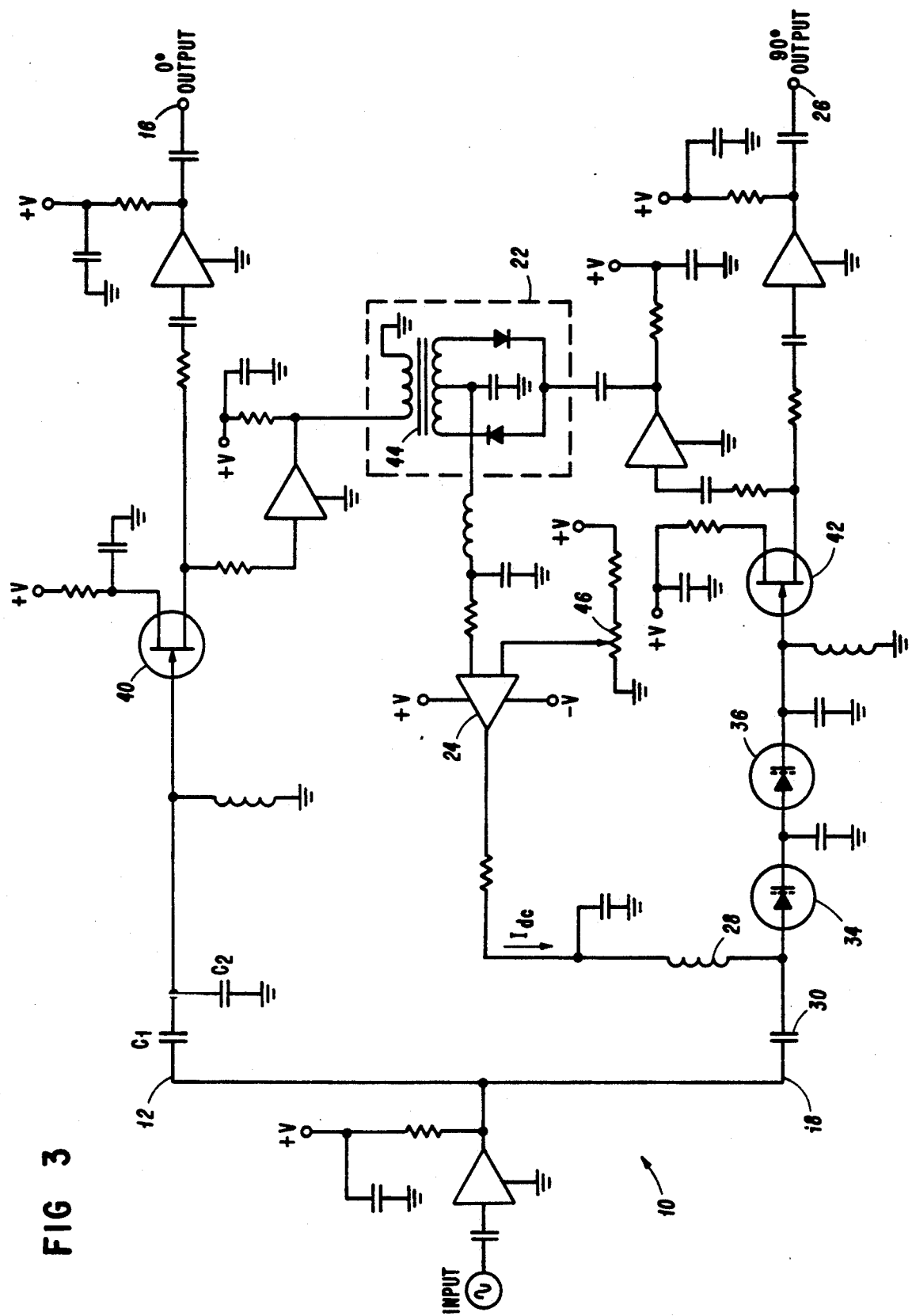
FIG. 3 is a detailed schematic diagram of the present invention.

Referring to FIG. 3, band splitter 10 is illustrate in a detailed schematic diagram. As shown in FIG. 3, phase detector 22 comprises a wide-band rf transformer 44. In addition to the error voltage from transformer 44, a phase set voltage signal is also applied to operational amplifier 24 through a potentiometer 46. FIG. 3 also illustrates JFET amplifiers 40 and 42 that simulate open circuit output conditions on non-shift channel 12 and phase-shift channel 18, respectively.

Although the present invention has been described with respect to a specific embodiment thereof, various changes and modifications may be suggested to one skilled in the art and it is intended that the present invention encompass such changes and modifications as fall within the scope of the appended claims.

I claim:

1. A phase splitter circuit, comprising:
   a first channel comprising a fixed attenuator for receiving an input signal and providing a non-phase-shifted output signal;
   a second channel comprising a filter for receiving said input signal and providing a phase-shifted output signal;
   a phase detector connecting said first and second channels and generating an error signal; and
   an operational amplifier for receiving said error signal and providing a control signal to said filter.

2. The phase splitter of claim 1, wherein said phase detector comprises a wide-band rf transformer.

3. The phase splitter of claim 1, wherein said filter comprises a low-pass RC filter.

4. The phase splitter of claim 3, wherein said RC filter includes a pin diode functioning as a variable resistor.

5. The phase splitter of claim 4, wherein said control signal provided by said operational amplifier comprises a dc signal for biasing said pin diode.

6. A broadband phase splitter for providing two output signals derived from a common input signal, comprising:
- a fixed attenuator for receiving the input signal and providing a first output signal;
- a low-pass RC filter for receiving the input signal and providing a second output signal that is phase shifted with respect to said first output signal;
- a wide-band rf transformer functioning as a phase detector and output signals, said transformer functioning as a phase detector and generating an error signal; and
- an operational amplifier for receiving said error signal and providing a control signal to said low-pass RC filter.

7. The broadband phase splitter of claim 6, wherein said RC filter includes a pin diode functioning as a variable resistor.

8. The broadband phase splitter of claim 7, wherein said control signal provided by said operational amplifier comprises a dc signal for biasing said pin diode.

9. The broadband phase splitter of claim 8, further comprising an inductor functioning as a radio frequency choke connected between said operational amplifier and said pin diode.

10. A broadband phase splitter circuit, comprising:
- a first channel comprising a fixed attenuator for receiving an input signal and generating a first output signal;
- a second channel comprising a low-pass RC filter for receiving said input signal and providing a second output signal having a phase shift with respect to said first output signal;
- a transformer phase detector connecting said first and second channels and generating an error signal corresponding to said phase shift between said first and second output signals; and
- an operational amplifier for receiving said error signal and generating a control signal for input to said low-pass RC filter.

11. The phase splitter circuit of claim 10, wherein said RC filter includes a pin diode functioning as a variable resistor.

12. The phase splitter circuit of claim 11, wherein said control signal generated by said operational amplifier comprises a dc signal for biasing said pin diode.

13. The phase splitter circuit of claim 12, further comprising an inductor functioning as a radio frequency choke connected between said operational amplifier and said pin diode.

14. The phase splitter circuit of claim 13, further comprising a capacitor functioning as a dc block connected between said radio frequency choke and the input signal.

* * * * *